US009980026B2

(12) United States Patent
Zadesky et al.

(10) Patent No.: US 9,980,026 B2
(45) Date of Patent: May 22, 2018

(54) METHOD FOR CLEARING WATER FROM ACOUSTIC PORT AND MEMBRANE

(71) Applicant: Apple Inc., Cupertino, CA (US)

(72) Inventors: Stephen P. Zadesky, Cupertino, CA (US); Fletcher R. Rothkopf, Cupertino, CA (US); Samuel Bruce Weiss, Los Altos, CA (US)

(73) Assignee: APPLE INC., Cupertino, CA (US)

(*) Notice: Subject to any disclaimer, the term of this patent is extended or adjusted under 35 U.S.C. 154(b) by 68 days.

(21) Appl. No.: 15/023,957

(22) PCT Filed: Sep. 30, 2013

(86) PCT No.: PCT/US2013/062571
§ 371 (c)(1),
(2) Date: Mar. 22, 2016

(87) PCT Pub. No.: WO2015/047378
PCT Pub. Date: Apr. 2, 2015

(65) Prior Publication Data

US 2016/0241945 A1 Aug. 18, 2016

(51) Int. Cl.

| | |
|---|---|
| ***H03G 11/00*** | (2006.01) |
| ***H04R 1/08*** | (2006.01) |
| ***H04R 3/00*** | (2006.01) |
| ***H04R 29/00*** | (2006.01) |
| *H04R 1/02* | (2006.01) |

(52) U.S. Cl.
CPC ............ *H04R 1/086* (2013.01); *H04R 3/007* (2013.01); *H04R 29/00* (2013.01); *H04R 1/023* (2013.01); *H04R 2499/11* (2013.01)

(58) Field of Classification Search
CPC ........ H05B 2203/021; H05B 2203/014; H05B 2203/022; H05B 2203/032; H05B 3/54; H05B 1/0244; G03F 7/70875
USPC .......................................................... 381/55
See application file for complete search history.

(56) References Cited

U.S. PATENT DOCUMENTS

| | | | |
|---|---|---|---|
| 3,950,627 | A | 4/1976 | Murata et al. |
| 5,041,330 | A | 8/1991 | Heerton et al. |
| 5,179,505 | A | 1/1993 | Matsuo |
| 5,258,592 | A | 11/1993 | Nishikawa et al. |
| 5,373,487 | A | 12/1994 | Crawford et al. |
| 6,166,662 | A | 12/2000 | Chuang |
| 6,292,358 | B1 | 9/2001 | Lee et al. |

(Continued)

FOREIGN PATENT DOCUMENTS

| | | |
|---|---|---|
| CN | 102565149 | 7/2012 |
| CN | 104517772 | 4/2015 |

(Continued)

OTHER PUBLICATIONS

What to do when gadgets get wet, Monday Aug. 23, 2010.*

(Continued)

*Primary Examiner* — Akelaw Teshale
(74) *Attorney, Agent, or Firm* — Brownstein Hyatt Farber Schreck, LLP

(57) ABSTRACT

A sealed acoustic port in the housing of an electronic device facilitating the elimination of liquid within the port. The acoustic port may include a heating element that when actuated can expedite the evaporation process of liquids accumulated within the port.

30 Claims, 8 Drawing Sheets

(56) References Cited

U.S. PATENT DOCUMENTS

| | | | |
|---|---|---|---|
| 6,389,143 B1 | 5/2002 | Leedom et al. | |
| 6,501,036 B2 | 12/2002 | Rochon et al. | |
| 6,855,173 B2 | 2/2005 | Ehrnsperger et al. | |
| 6,963,039 B1 | 11/2005 | Weng et al. | |
| 7,075,781 B2 | 7/2006 | Peng | |
| 7,087,850 B1 | 8/2006 | Murzanski | |
| 7,230,196 B2 | 6/2007 | Toyama | |
| 7,355,137 B2 | 4/2008 | Kawasaki et al. | |
| 7,365,281 B2 | 4/2008 | Yamaguchi et al. | |
| 7,580,533 B2 | 8/2009 | Schwartz | |
| 7,748,272 B2 | 7/2010 | Kranz et al. | |
| 7,764,936 B2 | 7/2010 | Nakasano et al. | |
| 7,865,210 B2 | 1/2011 | Wang et al. | |
| 8,059,490 B2 | 11/2011 | Rapps et al. | |
| 8,092,691 B2 | 1/2012 | Youngs et al. | |
| D653,640 S | 2/2012 | Kwon et al. | |
| 8,231,795 B2 | 7/2012 | Martin et al. | |
| 8,263,886 B2 | 9/2012 | Lin et al. | |
| 8,367,928 B2 | 2/2013 | Hsu et al. | |
| 8,371,866 B1 | 2/2013 | Su et al. | |
| 8,381,575 B2 | 2/2013 | Seo | |
| 8,416,542 B2 | 4/2013 | Nakamura | |
| 8,446,713 B2 | 5/2013 | Lai | |
| 8,462,514 B2 | 6/2013 | Myers et al. | |
| 8,470,252 B2 | 6/2013 | Odueyungbo | |
| 8,500,348 B2 | 8/2013 | Dumont et al. | |
| 8,482,305 B2 | 9/2013 | Johnson | |
| 8,526,175 B2 | 9/2013 | Yukawa et al. | |
| 8,562,095 B2 | 10/2013 | Alleyne et al. | |
| 8,591,240 B2 | 11/2013 | Jenks | |
| 8,614,897 B2 | 12/2013 | Tang | |
| 8,624,144 B2 | 1/2014 | Chiang | |
| 8,644,011 B2 | 2/2014 | Parkinson | |
| 8,683,861 B2 | 4/2014 | Humbert et al. | |
| 8,767,381 B2 | 7/2014 | Shukla et al. | |
| 8,770,996 B2 | 7/2014 | Hsu | |
| 8,800,764 B2 | 8/2014 | Wu | |
| 8,804,993 B2 | 8/2014 | Shukla et al. | |
| 8,826,558 B2 | 9/2014 | Priebe et al. | |
| 8,844,158 B2 | 9/2014 | Dehn | |
| 8,942,401 B2 | 1/2015 | Murayama | |
| 8,960,818 B2 | 2/2015 | Myers et al. | |
| 8,994,827 B2 | 3/2015 | Mistry et al. | |
| 9,013,888 B2 | 4/2015 | Trzaskos et al. | |
| 9,072,991 B2 | 7/2015 | Winters et al. | |
| 9,080,961 B2 * | 7/2015 | Adachi | B29B 13/08 |
| 9,084,053 B2 | 7/2015 | Parkins | |
| 9,084,357 B2 | 7/2015 | Shedletsky et al. | |
| 9,099,264 B2 | 8/2015 | Shedletsky et al. | |
| 9,105,420 B2 | 8/2015 | Shah et al. | |
| 9,129,757 B2 * | 9/2015 | Kanbayashi | H01H 9/04 |
| 9,161,434 B2 | 10/2015 | Merz et al. | |
| 9,164,539 B2 | 10/2015 | Wu | |
| 9,171,535 B2 * | 10/2015 | Abe | G10K 11/002 |
| 9,226,076 B2 | 12/2015 | Lippert et al. | |
| 9,240,292 B1 | 1/2016 | Lapetina | |
| 9,253,297 B2 | 2/2016 | Abe et al. | |
| 9,335,355 B2 | 5/2016 | Menzel et al. | |
| 2006/0210062 A1 | 9/2006 | DeMichele et al. | |
| 2007/0003081 A1 | 1/2007 | Ram et al. | |
| 2008/0302641 A1 | 12/2008 | Su | |
| 2009/0211360 A1 * | 8/2009 | Rapps | H04R 17/00 73/599 |
| 2009/0281251 A1 | 11/2009 | Bae et al. | |
| 2011/0103621 A1 * | 5/2011 | Lutz | H04R 23/002 381/164 |
| 2011/0279931 A1 * | 11/2011 | Nakamura | G01M 3/16 361/42 |
| 2012/0067711 A1 | 3/2012 | Yang | |
| 2013/0037396 A1 | 2/2013 | Yu | |
| 2013/0146491 A1 | 6/2013 | Ghali et al. | |
| 2013/0170685 A1 | 7/2013 | Oh et al. | |
| 2013/0242481 A1 | 9/2013 | Kim et al. | |
| 2014/0029206 A1 | 1/2014 | Wittenberg et al. | |
| 2014/0218877 A1 | 8/2014 | Wei et al. | |
| 2015/0003213 A1 | 1/2015 | Suwald | |
| 2015/0191370 A1 * | 7/2015 | Reedzt | C02F 1/46109 205/341 |
| 2016/0052017 A1 | 2/2016 | Weber et al. | |
| 2016/0239047 A1 | 8/2016 | Weber | |
| 2016/0379767 A1 | 12/2016 | Ely | |
| 2017/0025785 A1 | 1/2017 | Song et al. | |

FOREIGN PATENT DOCUMENTS

| | | |
|---|---|---|
| CN | 105049966 | 11/2015 |
| CN | 204906680 | 12/2015 |
| CN | 105323674 | 2/2016 |
| EP | 0799747 | 10/1997 |
| EP | 2326106 | 5/2011 |
| EP | 2640042 | 9/2013 |
| JP | S5620399 | 2/1981 |
| JP | 200353872 | 2/2003 |
| JP | 200483811 | 3/2004 |
| JP | 2004235724 | 8/2004 |
| JP | 2004244607 | 9/2004 |
| JP | 2011187298 | 9/2011 |
| JP | 2012253426 | 12/2012 |
| WO | WO2012/117476 | 9/2012 |
| WO | WO2015/167848 | 11/2015 |

OTHER PUBLICATIONS

International Search Report and Written Opinion, PCT/US2013/062571, 14 pages, dated Apr. 17, 2014.

Author Unknown, "What to Do when Gadgets Get Wet," http://gadgetshow.channel15.com/gadget-show/blog/what-to-do-when-gadgets-get-wet, 2 pages, dated Aug. 23, 2010.

* cited by examiner

METHOD FOR CLEARING WATER FROM ACOUSTIC PORT AND MEMBRANE

CROSS-REFERENCE TO RELATED APPLICATION

This application is a 35 U.S.C. § 371 application of PCT Patent Application No. PCT/US2013/062571, filed Sep. 30, 2013 and titled "Method for Clearing Water from Acoustic Port and Membrane," the disclosure of which is hereby incorporated herein by reference in its entirety.

TECHNICAL FIELD

This disclosure relates generally to a sealed acoustic port in the housing of an electronic device, and in particular, to removing liquids accumulated with an acoustic port.

BACKGROUND

Portable electronic devices are increasingly popular as they gain advanced functionality and improved durability. As a result, these devices are increasingly exposed to new environments which may introduce liquid or particulate matter within apertures of the device housing, potentially interfering with, or destroying, electronic components contained within the device. Accordingly, to prevent and impede ingress of foreign matter, many portable devices are manufactured with internal environmental seals enclosing apertures of the device housing. Examples of environmental seals include mesh gratings, foam inserts, liquid sealants, and rubber gaskets.

Certain portable electronic devices may provide elements such as microphones or speakers to receive or produce sounds through an aperture, or acoustic port, of the device housing. In some circumstances, foreign matter arrested by a seal may accumulate within the acoustic port, thereby obstructing and interfering with the performance of the element. Accordingly, many acoustic ports are manufactured with an additional mesh grating along the exterior of the device to impede accumulation of particulate foreign matter within the acoustic port.

However, external mesh gratings are often ineffective in preventing liquid ingress and accumulation within acoustic ports. Agitation of a portable device or inclusion of additional apertures and air channels may eliminate some accumulated liquid, but, for many portable devices, acoustic ports are small and removal of accumulated liquid has proven difficult.

Accordingly, there may be a need for an environmental seal to an acoustic port of a portable electronic device that effectively facilitates the elimination of liquid accumulated within the port.

SUMMARY

This application provides techniques for forming a sealed acoustic port in the housing of an electronic device that facilitates the elimination of liquid which may accumulate therein. In certain embodiments, a seal for an acoustic port may be thermally coupled to a heating element that, when actuated, can evaporate liquid accumulated within the port.

Embodiments described herein may relate to or take the form of an acoustic port formed in a housing of an electronic device. An aperture may extend through the housing to an interior volume defined within the housing. An acoustic membrane may be housed within the acoustic port and may have a central portion and an outer peripheral portion. The outer peripheral portion may be sealed to the interior surface of the housing around the perimeter of the aperture. The acoustic port may also include an electrical heating element thermally coupled to the acoustic membrane.

In various embodiments, the electrical heating element may be an electrically conductive mesh, an electrically conductive trace disposed on a face of the acoustic membrane, an electrically conductive coil, or an electrically conductive ring. In such embodiments, the electrical heating element may be positioned or disposed along the face of the acoustic membrane, adjacent to the acoustic membrane, or integrated within the seal portion between interior surface of the housing and the outer peripheral portion of the membrane.

Other embodiments described herein may relate to or take the form of a method of removing liquid from an acoustic cavity in the housing of an electronic device including at least the steps of detecting the presence of liquid within the acoustic cavity, increasing the temperature of a heating element thermally coupled to the acoustic cavity, determining the absence of liquid within the acoustic cavity, and thereafter, decreasing the temperature of the heating element.

In further embodiments, the temperature of the heating element may be controlled electrically. For example, increasing the temperature of the heating element may be accomplished by increasing an electrical current supplied to the heating element. In certain embodiments, decreasing the temperature of the heating element may be accomplished by decreasing or terminating an electrical current supplied to the heating element.

Embodiments described herein may relate to or take the form of an electronic device having a housing with an exterior surface and an interior surface defining an interior volume, an acoustic element positioned within the interior volume, an acoustic port extending from the exterior surface to the interior surface of the housing, a liquid-impermeable film having a drum portion and a seal portion, the seal portion coupled to the interior surface about the perimeter of the acoustic port such that the film and coupling form a liquid seal between the acoustic port and the interior volume, and a heating element thermally coupled to the liquid-impermeable film.

In certain embodiments, the electrical heating element may be an electrically conductive mesh, an electrically conductive trace disposed on a face of the liquid-impermeable film, an electrically conductive coil, or an electrically conductive ring. In such embodiments, the heating element may be positioned or disposed along the face of the drum portion of the liquid-impermeable film, adjacent to the liquid-impermeable film, or integrated within the seal portion between interior surface of the housing and the seal portion of the liquid-impermeable film. In these embodiments, the acoustic element may be a microphone element or a speaker element.

Other embodiments described herein may relate to or take the form of a method of removing liquid from an acoustic cavity in the housing of an electronic device including at least the steps of detecting that the portable electronic device has been immersed in liquid, determining that the portable electronic device has been removed from the liquid, increasing the temperature of a heating element thermally coupled to the acoustic cavity for a pre-determined period of time, and thereafter, decreasing the temperature of the heating element.

BRIEF DESCRIPTION OF THE DRAWINGS

Reference will now be made to representative embodiments illustrated in the accompanying figures. It should be understood that the following descriptions are not intended to limit the embodiments to one preferred embodiment. To the contrary, it is intended to cover alternatives, modifications, and equivalents as may be included within the spirit and scope of the described embodiments as defined by the appended claims.

DETAILED DESCRIPTION

Figure 1:
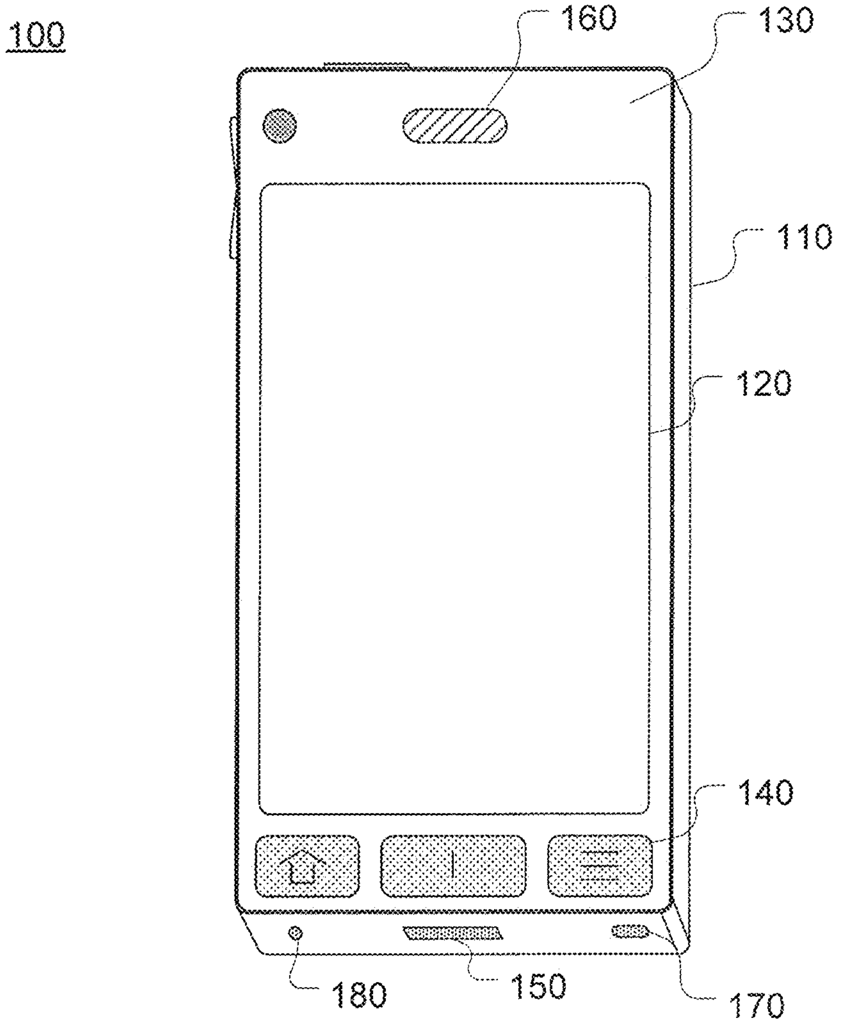
FIG. 1 is a perspective view of an sample embodiment of a portable electronic device.

Various embodiments of a sealed acoustic port in the housing of an electronic device facilitating the elimination of liquid within the port are described herein. The acoustic port may include a heating element that, when actuated, can evaporate liquids accumulated within the port or an associated channel. In certain embodiments, a sealed acoustic port may communicate with an internal channel defined in the housing of an electronic device. A first end of the internal channel may be sealed with a liquid-impermeable membrane. A second end of the internal channel may communicate with an exterior of the housing. An electronic component such as a microphone or a speaker may be acoustically coupled to the membrane. A mesh grating may be positioned within the internal channel.

In this configuration the mesh grating and membrane operate together to prevent debris and other foreign matter from entering the device via the internal audio channel. However, liquid may pass through the mesh grating with relative ease if the device is subjected to a liquid environment (such as being submerged). Once beyond the mesh grating, the liquid may be fully arrested by the liquid-impermeable membrane, thereby retaining the liquid within the internal channel. Residual liquid within the internal channel may substantially degrade the audio performance of the internal audio channel.

Certain embodiments discussed herein may include a heating element thermally coupled to the membrane or the internal channel. The heating element may be activated to increase the temperature of the membrane or internal channel. In this way, the heating element may evaporate residual liquid from within the channel.

In certain embodiments, the heating element may be positioned within the channel. In other embodiments, the heating element may be positioned along the housing of the electronic device adjacent to the channel. In still further embodiments, the heating element may be positioned on a face of the liquid-impermeable membrane. In further embodiments, the heating element may be formed as a component of a seal which bonds the membrane to the housing.

In certain embodiments, the heating element may be an electrically conductive mesh. An electrical current may be applied to the conductive mesh to induce an ohmic heating effect within the mesh. The material selected for the conductive mesh may be based at least in part upon electrical resistance properties.

In further embodiments, the heating element may be a conductive trace or coil disposed upon a surface of the liquid-impermeable membrane. The conductive trace may be disposed upon the membrane in any number of ways including subtractive methods such as etching, additive methods such as printing, electroplating, or vapor deposition, or bonding methods such as with adhesive.

In alternate embodiments, the material selected for the liquid-impermeable membrane may be of sufficient electrical resistance such that a separate heating element is not required. In such a case, the liquid-impermeable membrane may be connected to an electrical circuit such that when an electrical current is applied an ohmic heating effect is induced in the membrane directly.

In still further embodiments, residual liquid may be removed using alternate methods. For example, the internal audio channel may be intentionally positioned with the housing to be thermally proximate a local system heat source such as a light emitting diode, a power amplifier, or a processor. Upon detection of liquid present proximate the membrane or internal audio channel, the local system heat source may be activated in a mode selected to increase the temperature of the membrane or internal audio channel.

In alternate embodiments, residual liquid may be removed from the membrane or internal audio channel by physical agitation of the membrane. For example, a speaker may be tuned to emit a selected frequency which may vibrate the membrane to remove residual liquid. In certain embodiments, the selected frequency may be ultrasonic.

In further embodiments, the presence of liquid within an internal audio channel of a portable electronic device may be detected directly. For example, a processor associated with the portable electronic device may interrogate a known property of an element adjacent to or associated with the internal audio channel. If the interrogated value is sufficiently different from the known property, the processor may initiate the process of eliminating liquid from within the internal audio channel. Examples of a property which a processor may periodically interrogate may include capacitance, resistance, audio attenuation, and natural resonance frequencies.

For example, a sensor may measure capacitance of the membrane and/or mesh. Liquid adjacent or abutting the membrane and/or mesh may change the measured capacitance. Thus, if the measured capacitance of the membrane or mesh changes, the processor may initiate the process of eliminating liquid from within the internal audio channel. In other embodiments, the processor may determine that the resistance across the liquid-impermeable membrane or conductive mesh has changed, thereafter initiating the liquid removal process.

In still further embodiments, the processor may cooperate with a microphone and/or speaker to detect attenuation caused by residual liquid within the internal channel. In certain embodiments, a speaker may emit a particular sound for the microphone to receive and the processor to analyze. If the processor determines that the microphone received a frequency-shifted the signal from the speaker, the processor may initiate the liquid removal process.

In further embodiments, the presence of liquid within an internal channel of a portable electronic device may be detected through the use of any suitable sensor. As one example, a processor associated with the portable electronic device may be coupled to one or more sensors that are capable of determining immersion within a liquid. Examples of suitable immersion sensors include a humidity sensor, a resistive sensor such as an exposed electrode pair, and a capacitive sensor such as a touch screen. Once the processor determines that an immersion has occurred, the processor may wait until the electronic device is no longer immersed in liquid. After the processor determines that the device has been removed from the liquid, the processor may initiate the liquid removal process under the indirect assumption that residual liquid is present within internal audio channels of the electronic device.

Although embodiments discussed herein relate to or generally take the form of internal audio channels associated with acoustic elements such as microphones and speakers, one may appreciate that other device apertures are contemplated. For example, the liquid elimination techniques described herein may be applied to apertures and cavities surrounding a variety of portable electronic device elements including data ports, altimeter ports, optical ports, camera lenses and so on.

FIG. 1 is a perspective view of an sample embodiment of a portable electronic device. FIG. 1 shows a portable cellular telephone as the portable electronic device 100. It may be appreciated that a cellular telephone is meant to be an example only and other electronic devices are envisioned such as media players, media storage devices, personal digital assistants, tablet computers, portable computers, GPS units, wearable devices such as glasses and watches, remote controls, and the like.

The portable electronic device 100 may include a housing 110, a display area 120, a cover window 130, a button 140, an input/output data port 150, an earpiece speaker 160, a loudspeaker 170, and a microphone 180. The housing 110 may be constructed of a material suitably durable for portable use, such as metal or rigid plastic. The display area 120 may consume a majority if not all of the front surface of the electronic device 100. The display area 120 may include a display such as a liquid crystal display (LCD) or a thin film transistor (TFT) display or any other display suitable to visually convey information to a user. The portable electronic device 100 may additionally include a cover window 130 that is positioned over the display area 120 and extends to cover the majority of the surface area of the front portion of the portable electronic device 100.

The cover window 130 may be formed of a scratch resistant glass, sapphire, plastic or other suitable material. The housing 110 and the cover window 130 may be sealed to one another in a manufacturing process. The seal may prevent foreign contaminants such as particulate matter or liquid from entering through a seam at the interface between the components. The seal between the housing 110 and the cover window 130 may be formed by any suitable process. In certain embodiments, the seal may be a gasket ring or a liquid sealant, such as an adhesive.

Certain elements within the portable electronic device 100 may employ an aperture through either the display window 130 or the housing 110 in order to function. For example, the input/output data port 150 may define an aperture though the housing 110 so that a mating connection may be made with an external data cord (not shown). The earpiece speaker 160 may also transmit through an aperture formed in the cover window 130. The loudspeaker 170 may be positioned along the base of the device adjacent to the input/output data port 150 and may also transmit through an aperture though the housing 110 so that audio emitted from the loudspeaker 170 is not attenuated by the housing 110. The microphone 180 may likewise operate through an aperture formed in the housing.

Figure 2:
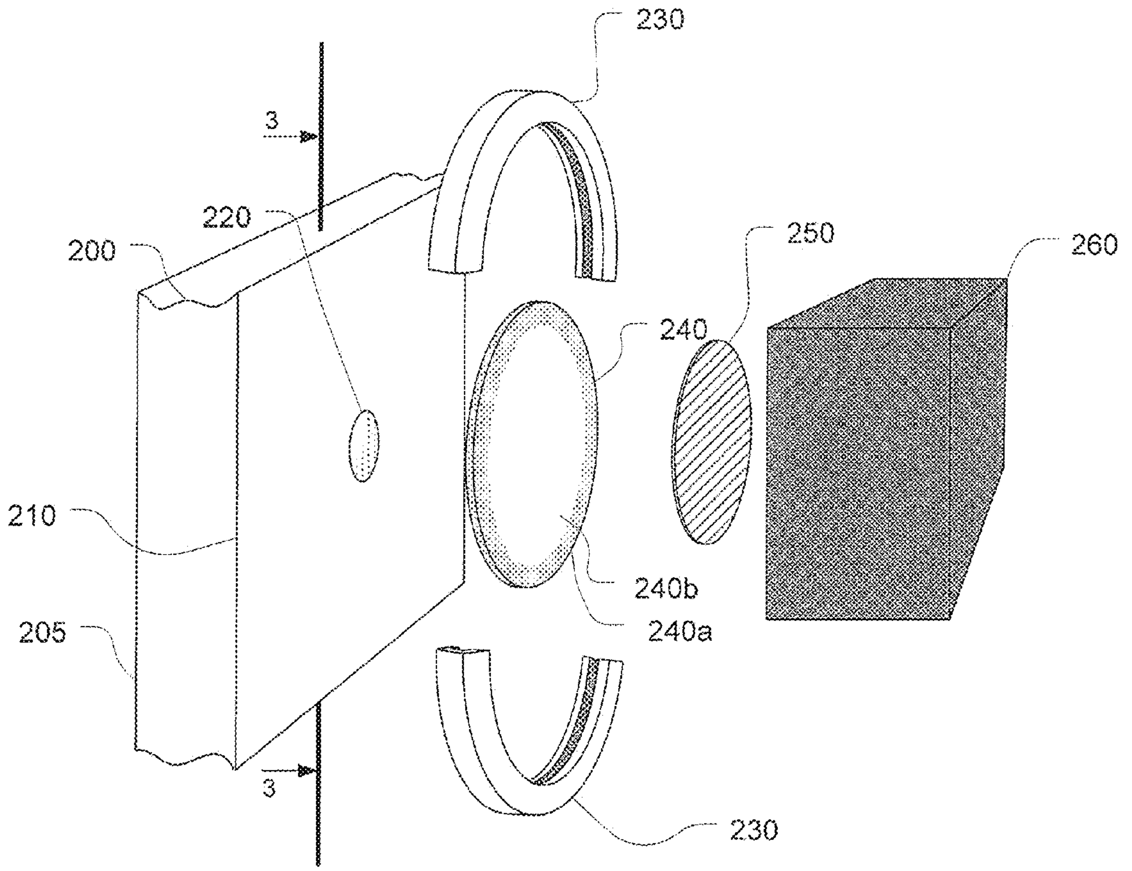
FIG. 2 is an exploded cutaway view of an sample embodiment of an acoustic port having a heating element positioned behind an acoustic membrane.

FIG. 2 is an exploded view of a sample embodiment of an acoustic port having a heating element positioned behind an acoustic membrane. Shown in FIG. 2 is a cutaway view of a portion of the housing 200 having an exterior surface 205 and an interior surface 210. Through the housing 200, extending from the exterior surface 205 to the interior surface 210, is an aperture (also referred to herein as an "interior audio port") 220. Encircling the interior audio port 220 is a seal 230 bonding the interior surface 210 of the housing 200 with an outer peripheral portion 240*a* of a membrane 240. The outer peripheral portion 240*a* may fit within a groove or channel provided in the seal 230. Further, it may be appreciated that the seal 230 is illustrated as two separate components only for clarity. The membrane 240 may, in certain embodiments, be constructed of a liquid-impermeable material. The seal 230 may not be bonded to a central portion 240*b* of the membrane 240. In this way, the central portion 240*b* of the membrane 240 is free to oscillate or resonate in response to changes in pressure within the interior audio port 220. Positioned behind the membrane 240 is a heating element 250. Although illustrated as substantially circular elements, it may be appreciated that the interior audio port 220, the seal 230, the membrane 240 and the heating element 250 need not necessarily take a substantially circular form or need not necessarily take the same forms as one another. For example, the interior audio port 220 may take a rectangular shape while the seal 230 and membrane 240 take an oval shape. Any number of suitable shapes and/or configurations are envisioned.

The heating element 250 may be constructed of any suitable material, but in certain embodiments the heating element 250 is constructed of an electrically conductive mesh. The heating element 250 may have a known resistance such that when an electrical current is passed through the heating element 250, an ohmic heating effect is induced. In certain embodiments, the heating element 250 is thermally coupled to the central portion 240*b* of the membrane

240 such that when the heating element 250 begins to rise in temperature, the temperature of the central portion 240*b* may also rise.

Positioned behind the heating element 250 in the exploded view shown in FIG. 2 is an acoustic element enclosure 260. Within the acoustic element enclosure 260 may be an isolated cavity (not shown), in which an acoustic element (not shown) such as a microphone or speaker may be placed. The acoustic element enclosure may be bonded to the membrane 240 using, for example, an adhesive.

Figure 3A:
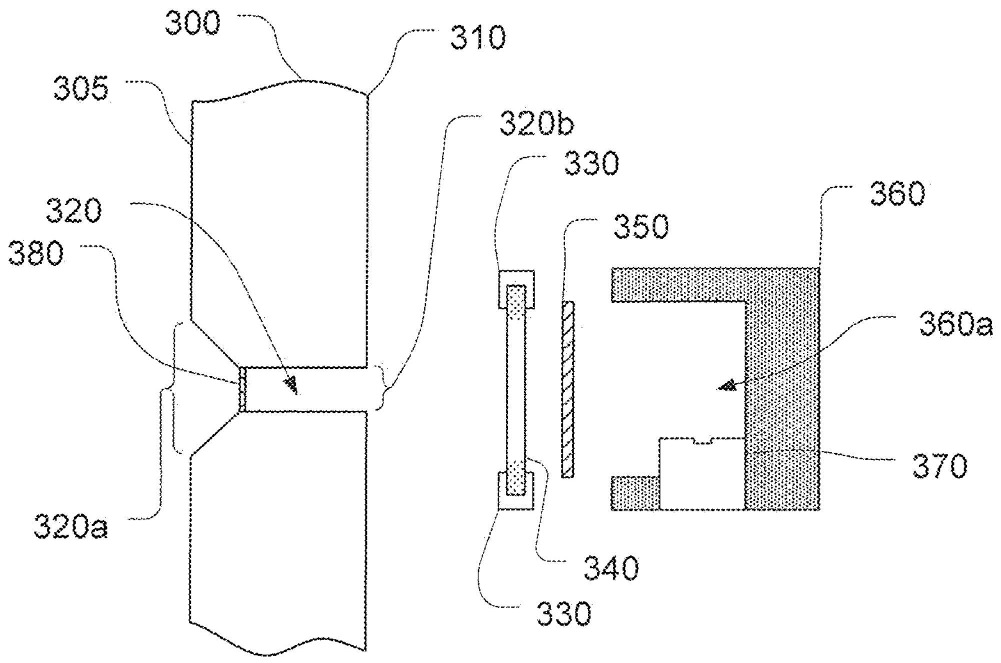
FIG. 3A is an exploded schematic cross-section taken along line 3-3 of FIG. 2. of an sample embodiment of an acoustic port having a heating element.

FIG. 3A is an exploded schematic cross-section taken along line 3-3 of FIG. 2, showing a sample embodiment of an acoustic port having a heating element. Shown in FIG. 3 in cross section is the housing 300 having an exterior surface 305 and an interior surface 310. An interior audio port 320 extends through the housing 300 extending from the exterior surface 305 to the interior surface 310 and has an exterior opening 320*a* and an interior opening 320*b*. In certain embodiments, the exterior opening 320*a* may be flanged. Positioned in the interior of the housing 300 (or in a cavity defined within the housing sidewall) are the seal portion 330, the membrane 340, the heating element 350, and the acoustic element enclosure 260. Within the acoustic element enclosure 360 is an isolated cavity 360*a*, which encloses an acoustic element 370. The acoustic element 370 may be and suitable type of electronic element, and in certain embodiments the acoustic element 370 may be a microphone.

A mesh grating 380 may be positioned at or near the exterior surface 305 of the housing 300 in such a fashion as to extend across the internal channel 320. The mesh grating 380 may prevent particulate matter from passing through to the interior opening 320*b*. At the same time, the mesh grating 380 may also permit sound waves to pass through the interior audio channel 320 to excite or otherwise couple to the acoustic element 370 enclosed in the isolated cavity 360*a*. Likewise, in embodiments where the acoustic element 370 is a speaker, the mesh 380 permits sound waves to exit the interior audio channel 320. One may appreciate that the mesh grating 380 may also be positioned along the exterior opening 320*a*, or along the interior opening 320*a*. In further embodiments more than one mesh grating may be used.

Figure 3B:
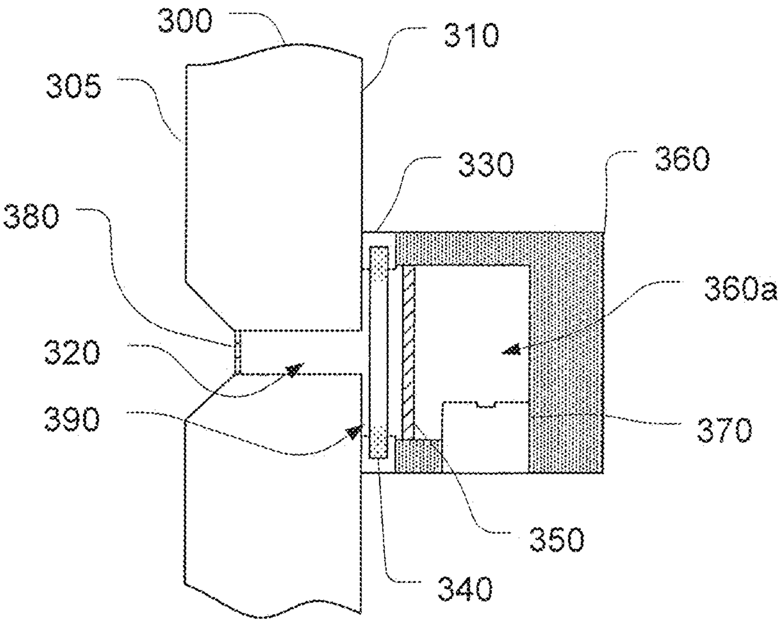
FIG. 3B is a schematic cross-section of the embodiment illustrated by FIG. 2.

FIG. 3B is a schematic cross-section of the embodiment illustrated by FIG. 2 and FIG. 3A. In certain embodiments, sound waves may enter the acoustic port, pass through the grated mesh 380, and impact the membrane 340, which in turn transmits the sound waves to the interior volume and 360*a* and so to the acoustic element 370, which may convert the pressures of the sound waves into an electrical signal.

As noted with respect to FIG. 3A, a heating element 350 may be disposed along the face of the central portion of the membrane 340 which is oriented toward the isolated chamber 360*a* of the acoustic element enclosure 360. In the illustrated configuration, the heating element 350 may be thermally coupled to the membrane 340, which may in turn be thermally coupled to the interior audio port 320.

In this configuration, when liquid travels into the internal audio channel 320 and enters through the mesh grating 380, the liquid may be arrested by the combination of seal 330 and the membrane 340. Once liquid is present within the internal audio channel 320, it may leak into a cavity 390 formed between the membrane 320 and the interior surface 310 of the housing 300. Thus, both the cavity 390 and internal channel 320 may contain water or another liquid once water passes through the membrane 340.

When a current flows through the heating element 350, the heating element's temperature increases due to the electrical resistance of the element. In some embodiments, the membrane 340 may also increase in temperature. Once the membrane 340 reaches a sufficiently high temperature, the liquid in the cavity 390 and channel 320 may evaporate. Accordingly, by activating the heating element 350 to induce an increase in temperature within the element, residual liquids within the internal audio channel 320 or within the cavity 390 may evaporate faster than if no heat is applied.

Figure 3C:
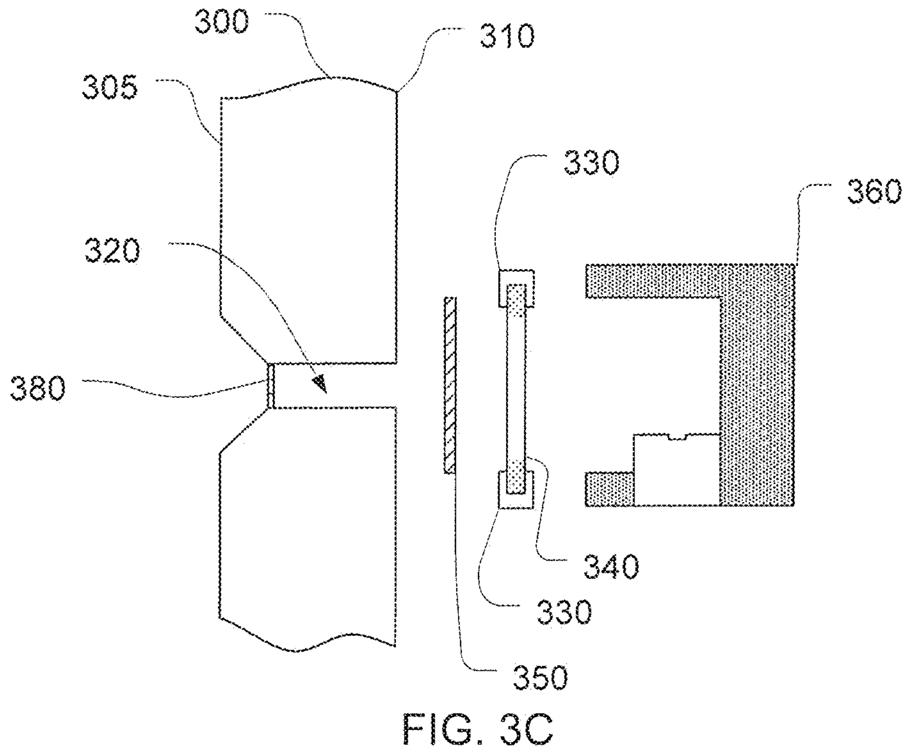
FIG. 3C is an exploded schematic cross-section of an sample embodiment of an acoustic port having a heating element positioned in front of an acoustic membrane.

FIG. 3C is an exploded schematic cross-section of an sample embodiment of an acoustic port having a heating element positioned in front of an acoustic membrane, similar to the embodiments of FIGS. 3A-3B. As shown, a heating element 350 may be positioned along a face of a membrane 340 which faces the interior surface 310 of the housing 300 (e.g., on the side of the membrane facing the cavity 390 and channel 320). In this manner, the heating element 350 may directly heat liquid in the internal audio channel 320 and/or cavity 390 in order to facilitate rapid evaporation, rather than heating the membrane and having the membrane heat liquid.

Figure 3D:
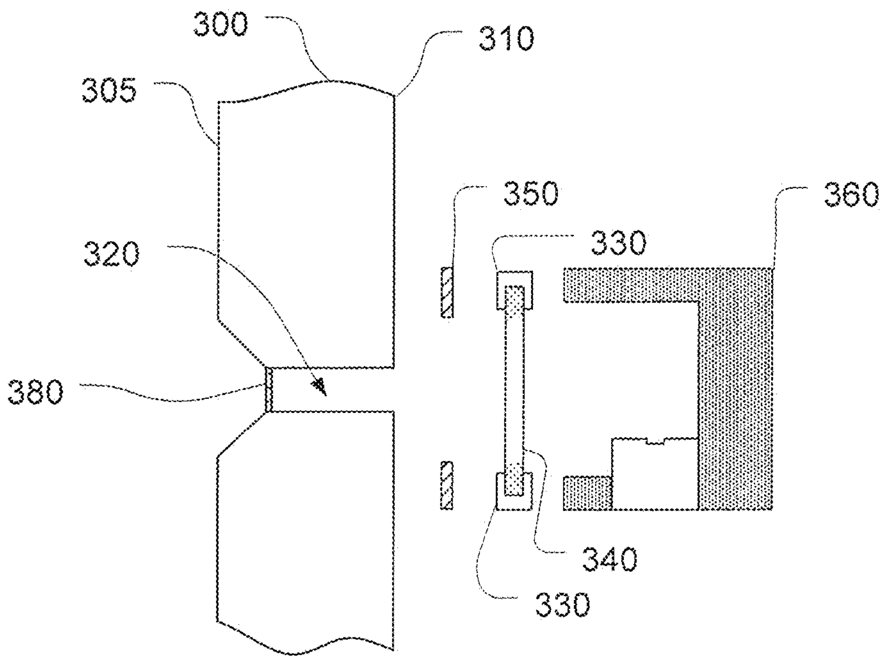
FIG. 3D is an exploded schematic cross-section of an sample embodiment of an acoustic port having a heating element formed as a ring about a seal portion an acoustic membrane.

FIG. 3D is an exploded schematic cross-section of an sample embodiment of an acoustic port having a heating element formed as a ring about a seal portion an acoustic membrane, similar to the embodiments of FIGS. 3A-3B. As shown, a heating element 350 may be positioned within the seal 330 itself. In alternative embodiments, the seal 330 may be the heating element 350, such that there is no separate heating element. One may appreciate that the heating element 350, although drawn in cross section, may have the same shape as the seal portion 330. In other words, heating element 350 may take the shape of a ring.

Figure 3E:
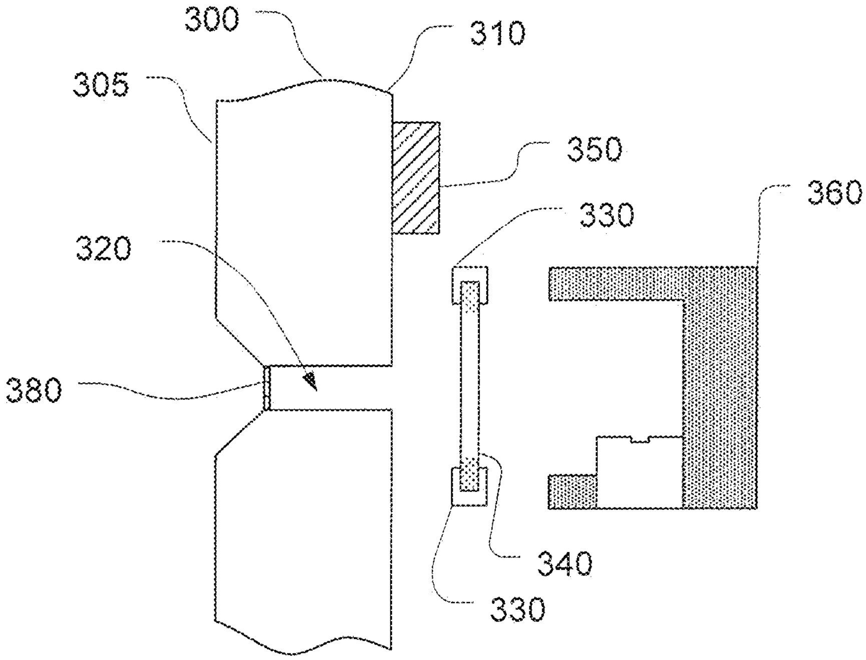
FIG. 3E is an exploded schematic cross-section of an sample embodiment of an acoustic port having a heating element positioned to thermally couple directly to the housing of an electronic device.

One may further appreciate that the orientation and location of the heating element 350 need not be within the sealed structure of the acoustic port. For example, FIG. 3E shows an exploded schematic cross-section of an sample embodiment of an acoustic port having a heating element 350 positioned adjacent to the interior surface 310 of the housing 300 of an electronic device. When the heating element 350 is activated, the interior surface 310 of the housing 300 of the device proximate the heating element 350 may also increase in temperature. As the housing 300 surrounds the internal audio channel 320, one may appreciate that the temperature within the internal audio channel 320 may also rise, in order to facilitate rapid evaporation of liquids present therein. Further, a portion of the housing 310 proximate the heating element 350 may be formed from a different material than the rest of the housing Although illustrated as a separate element, one the heating element 350 may perform an additional function with respect to operation of the electronic device. For example, the heating element may be another electronic component contained within the housing 300 of the electronic device that is known to produce heat. For example, an electronic element known to produce heat may be a processor, power amplifier, or light emitting diode.

Figure 3F:
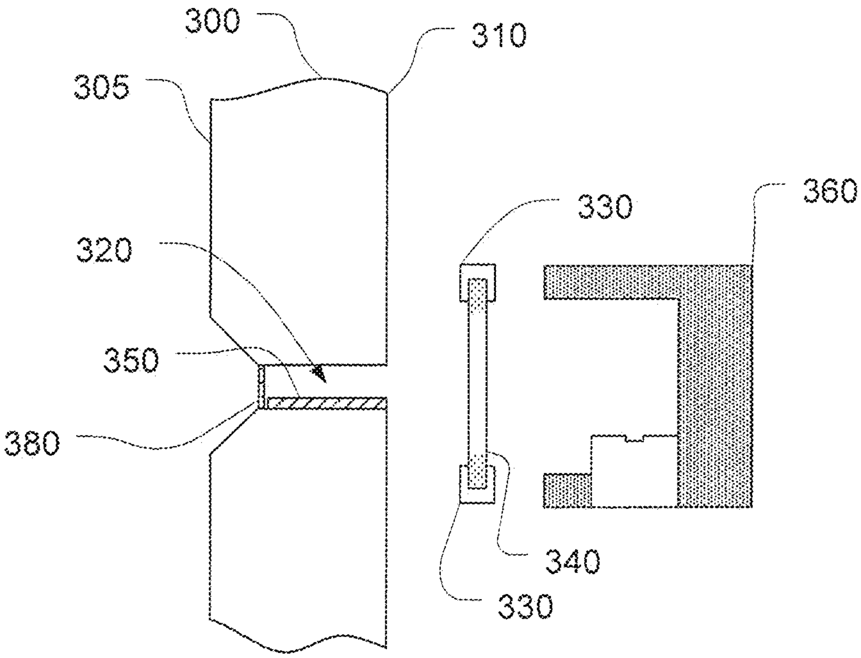
FIG. 3F is an exploded schematic cross-section of an sample embodiment of an acoustic port having a heating element positioned within an acoustic port of an electronic device.

FIG. 3F is an exploded schematic cross-section of an sample embodiment of an acoustic port having a heating element 350 positioned within an internal audio channel 320 of an electronic device. The heating element 350 may be thermally coupled to the interior of the housing 300 within the sidewalls defining the internal audio channel 320. When actuated, the heating element 350 may increase in temperature which in turn may increase the temperature of the internal audio channel 320, facilitating rapid evaporation of liquids present therein.

As described with respect to FIGS. 2-3F, the heating element 350 may be electrically activated. In certain embodiments, the heating element may be an electrically conductive mesh. As previously described, an electrical current may be applied to the conductive mesh to induce an ohmic heating effect; heat may be transferred to any component, structure or the like to which the heating element is connected or adjacent. The material selected for the conductive mesh may be based at least in part upon electrical resistance properties.

In other embodiments, the heating element 350 may take the form of a conductive pattern or material having a non-mesh shape, such as the ring embodiment illustrated in FIG. 3D, or in another example a coil of conductive material that is positioned around or adjacent to the internal audio port 320. As with conductive mesh, an electrical current may be applied to the conductive material to induce an ohmic heating effect therein. In still further embodiments, the seal 330, the membrane 340, and/or the housing 300 may be capable of a controlled increase in temperature. For example, the seal 330, the membrane 340, and/or the housing 300 may be constructed of an electrically conductive material such that an electrical current may be applied to induce an ohmic heating effect.

Although throughout the disclosure the heating element 350 is referred to as a singular element, it may be appreciated that in certain embodiments multiple heating elements may be thermally coupled facilitate rapid evaporation of liquid from a single internal audio channel 320. Thus, references to a single heating element 350 should be understood to embrace multiple heating elements.

Figure 4A:
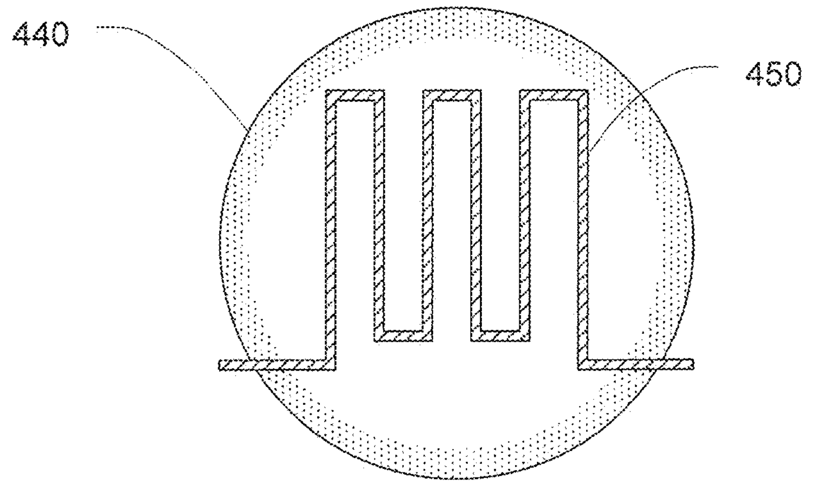
FIG. 4A is a plan view of an acoustic membrane of an sample embodiment of an acoustic port, the acoustic membrane having a heating element disposed on its surface as a conductive trace following a serpentine path.

In further embodiments, the heating element 350 may not necessarily be a separate element. For example in certain embodiments, a heating element 350 may be an electrically conductive trace disposed on a face of the membrane 340. FIG. 4A is a plan view of an acoustic membrane of an sample embodiment of an acoustic port, the membrane 440 having a heating element 450 disposed on its surface as a conductive trace following a serpentine path. When an electrical current is applied to the conductive trace, an ohmic heating effect may be induced in the trace and that heat passed to membrane 440 to evaporate liquids. In some embodiments, the serpentine heating element may be formed on the side of the membrane that comes into contact with liquids, so that heat transmission to or through the membrane is not necessary. It should be appreciated that any heating element described herein may be positioned on either side of a corresponding membrane.

Figure 4B:
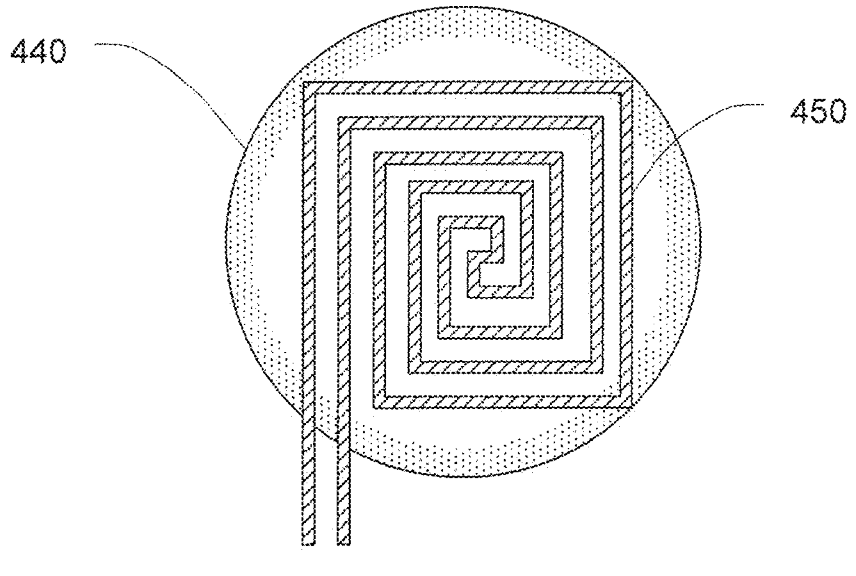
FIG. 4B is a plan view of an acoustic membrane of an sample embodiment of an acoustic port, the acoustic membrane having a heating element disposed on its surface as a conductive trace following a coiled path.

FIG. 4B is a plan view of an membrane 440 of an sample embodiment of an acoustic port, the membrane 440 having a heating element 450 disposed on its surface as a conductive trace following a coiled path. As with the related embodiment shown in FIG. 4A, when an electrical current is applied to the conductive trace, an ohmic heating effect may be induced in the trace and heat transferred to the membrane 440.

Further, the temperature increase within any afore-described heating element 250, 350, 450, 552 may be controlled, regulated or otherwise intentionally set. For example, if the heating element is an electrically-controlled element, the electrical current supplied to the element may be raised at a constant rate. In another embodiment, the current supplied to the element may be pulsed into the heating element to induce a very rapid temperature increase within the element.

Figure 5:
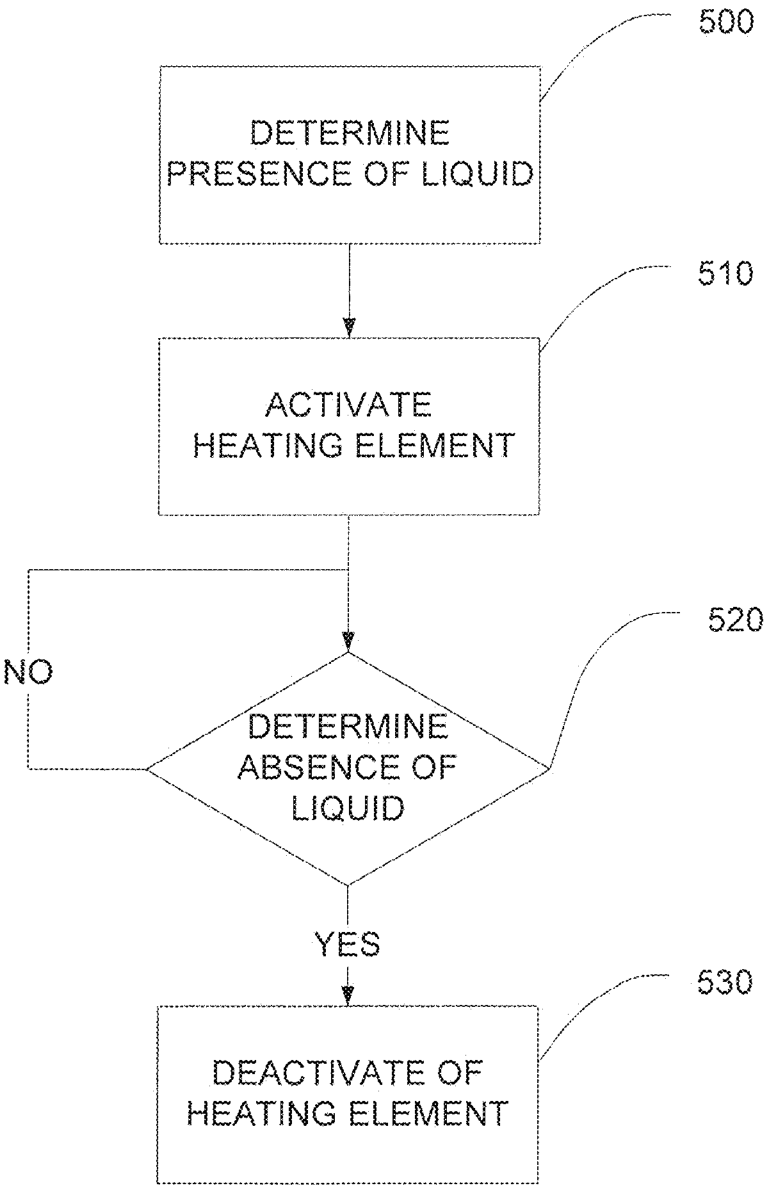
FIG. 5 is a representative flow chart of a process of removing liquid accumulated within an acoustic port.

FIG. 5 is a representative flow chart of a process of removing liquid accumulated within an acoustic port. The process begins in operation 500, in which a processor associated with the portable electronic device at may periodically interrogate a known property of an element adjacent to or associated with the internal audio channel. If the interrogated value is sufficiently different from the known property, the processor may initiate the process of eliminating liquid from within the internal audio channel. Examples of a property which a processor may periodically interrogate may include capacitance, resistance, and/or natural resonance frequencies.

At operation 510, a temperature increase may be induced at a heating element or, in other words, a heating element may be activated. As described above, the temperature increase may be controlled or otherwise intentionally set.

At operation 520, the processor may determine the absence of liquid from within the internal audio channel. If the operation 520 determines that liquid is present, the process may repeat after a delay. For example, the processor associated with the portable electronic device may interrogate a known property of an element adjacent to or associated with the internal audio channel. If the interrogated value is sufficiently similar to the expected value, the processor may determine that liquid is not present within internal audio channel. On the other hand, if the interrogated value is sufficiently different from the expected value, the processor may determine that liquid is still present within the internal audio channel. If liquid remains in the channel, the processor in one embodiment may continue to provide power to the thermal element. In an alternate embodiment, the processor may periodically or aperiodically increase the temperature of the thermal element up to a certain threshold, determining optionally before each increase in temperature whether liquid is present within the internal audio channel.

At operation 530, the temperature of the heating element may be decreased or the heating element may be immediately deactivated. As described with respect to increasing the temperature of the heating element, the decrease in temperature of the heating element may be controlled.

Figure 6:
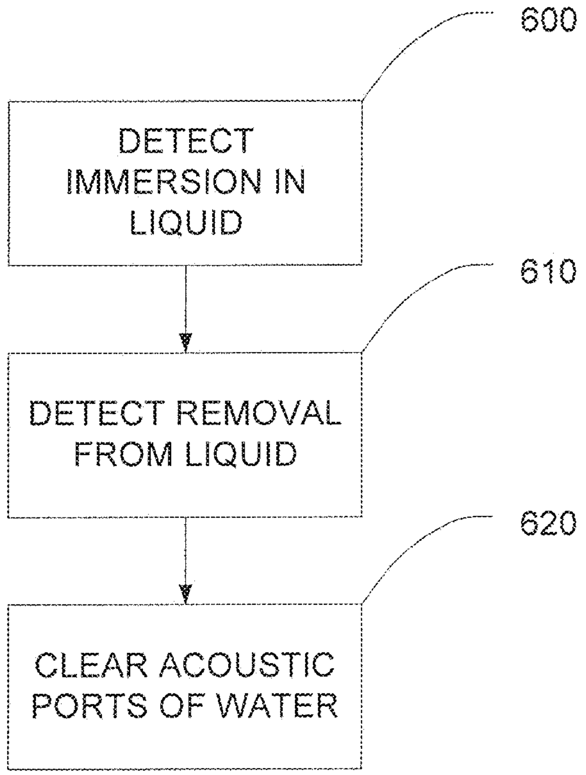
FIG. 6 is a representative flow chart of an alternative process of removing liquid accumulated within an acoustic port.

FIG. 6 is a representative flow chart of a process of detecting liquid accumulated within an acoustic port. First, a processor may determine at 600 whether a device is immersed in liquid. For example, a processor associated with the portable electronic device may be coupled to one or more sensors that are capable of determining immersion within a liquid. Examples of an immersion sensor include a humidity sensor, a resistive sensor such as an exposed electrode pair, or a capacitive sensor such as a touch screen. Once the processor determines that an immersion has occurred, the processor may wait until it is determined at 610 that the electronic device is no longer immersed in liquid. After the processor determines that the device has been removed from the liquid, the processor may initiate the liquid removal process at 620 under the indirect assumption that residual liquid is present within internal audio channels of the electronic device.

One may appreciate that although many embodiments are disclosed above, that the operations presented in FIGS. 5-6 are meant as sample and accordingly are not exhaustive. One may further appreciate that alternate step order, or additional steps or fewer steps may be required.

Where components or modules of the invention are implemented in whole or in part using software, in one embodiment, these software elements can be implemented to operate with a computing or processing module capable of carrying out the functionality described with respect thereto.

Although the invention is described above in terms of various sample embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described sample embodiments but is instead defined by the claims herein presented.

We claim:

1. An apparatus for evaporating a liquid accumulated in an acoustic port, the apparatus comprising:
- a housing having an exterior surface and an interior surface and defining a cavity;
- an aperture extending from the exterior surface to the interior surface of the housing;
- an acoustic membrane positioned within the cavity and covering the aperture;
- a seal positioned around the aperture and configured to isolate the aperture from the cavity; and
- an electrical element positioned within the cavity and coupled to the acoustic membrane,
- the electrical element configured to increase a temperature of the acoustic membrane and evaporate the liquid accumulated in the acoustic port.

2. The apparatus of claim 1, wherein the electrical element comprises an electrically conductive mesh.

3. The apparatus of claim 2, wherein the electrically conductive mesh is positioned on a side of the acoustic membrane facing the exterior surface.

4. The apparatus of claim 2, wherein the electrically conductive mesh is positioned within the housing.

5. The apparatus of claim 1, wherein the electrical element comprises an electrically conductive trace disposed on a face of the acoustic membrane.

6. The apparatus of claim 5, wherein the face comprises a surface of the membrane oriented toward an interior of the housing.

7. The apparatus of claim 5, wherein the face comprises a surface of the membrane oriented toward the aperture.

8. The apparatus of claim 1, wherein the electrical element comprises an electrically conductive ring disposed on a portion of the acoustic membrane.

9. A method of removing liquid from an acoustic cavity in a housing of an electronic device comprising:
- detecting, using a sensor of the electronic device, the presence of liquid within the acoustic cavity;
- increasing, by the electronic device, a temperature of a heating element within the electronic device and thermally coupled to the acoustic cavity to evaporate the liquid in the acoustic cavity; and
- decreasing, by the electronic device, the temperature of the heating element.

10. The method of claim 9, wherein the heating element comprises an electrically conductive mesh.

11. The method of claim 9, wherein heating element comprises an electrically conductive trace.

12. The method of claim 9, wherein heating element comprises an electrically conductive ring surrounding the acoustic cavity.

13. The method of claim 9, wherein the temperature of the heating element is electrically controlled.

14. The method of claim 13, wherein increasing the temperature of the heating element comprises increasing an electrical current supplied to the heating element.

15. The method of claim 14, wherein decreasing the temperature of the heating element comprises decreasing or terminating an electrical current supplied to the heating element.

16. An electronic device comprising:
- a housing having an exterior surface and an interior surface that defines an interior volume;
- a port extending from the exterior surface to the interior surface of the housing;
- a mesh grating covering the port and positioned adjacent the exterior surface of the housing;
- an electronic element positioned within the interior volume and defining a cavity that at least partially surrounds the port;
- a liquid-impermeable film having a drum portion and a seal portion, the drum portion covering the port and the seal portion forming a seal between the electronic element and the housing; and
- a heating element disposed at least partially within the cavity and thermally coupled to a surface of the liquid-impermeable film, the heating element operable to evaporate liquid in the port.

17. The electronic device of claim 16, wherein the heating element is positioned adjacent to the seal portion of the liquid-impermeable film.

18. The electronic device of claim 16, wherein the heating element is disposed on a face of the drum portion of the liquid-impermeable film at least partially within the cavity.

19. The electronic device of claim 16, wherein the heating element comprises an electrically conductive mesh.

20. The electronic device of claim 16, wherein the heating element comprises an electrically conductive trace disposed on a surface of the liquid-impermeable film.

21. The electronic device of claim 16, wherein the heating element comprises an electrically conductive coil.

22. The electronic device of claim 16, wherein the heating element comprises an electrically conductive ring.

23. The electronic device of claim 16, wherein the electronic element comprises a microphone.

24. The electronic device of claim 16, wherein the electronic element comprises a speaker.

25. A method of removing liquid from an acoustic cavity in a housing of an electronic device comprising:
- detecting, using a sensor of the electronic device, immersion of the electronic device within a liquid;
- increasing a temperature of a heating element within the electronic device and thermally coupled to the acoustic cavity for a period of time to evaporate the liquid in the acoustic cavity; and
- decreasing the temperature of the heating element.

26. The method of claim 25, wherein the heating element comprises an electrically conductive mesh.

27. The method of claim 25, wherein heating element comprises an electrically conductive trace.

28. The method of claim 25, wherein heating element comprises an electrically conductive ring surrounding the acoustic cavity.

29. The method of claim 25, wherein the temperature of the heating element is electrically controlled.

30. The method of claim 29, wherein increasing the temperature of the heating element comprises increasing an electrical current supplied to the heating element.

* * * * *